United States Patent [19]

Doan

[11] Patent Number: 5,204,286

[45] Date of Patent: Apr. 20, 1993

[54] METHOD OF MAKING SELF-ALIGNED CONTACTS AND VERTICAL INTERCONNECTS TO INTEGRATED CIRCUITS

[75] Inventor: Trung T. Doan, Boise, Id.

[73] Assignee: Micron Technology, Inc., Boise, Id.

[21] Appl. No.: 775,744

[22] Filed: Oct. 15, 1991

[51] Int. Cl.$^5$ ............................................. H01L 21/44
[52] U.S. Cl. .................................... 437/195; 437/192;
    437/193; 148/DIG. 50
[58] Field of Search ............... 437/195, 190, 192, 193;
    148/DIG. 50

[56] References Cited

U.S. PATENT DOCUMENTS

| | | | |
|---|---|---|---|
| 4,840,923 | 6/1989 | Flagello et al. | 437/195 |
| 4,866,009 | 9/1989 | Matsuda | 437/195 |
| 4,900,695 | 2/1990 | Takahashi et al. | 437/195 |
| 5,010,039 | 4/1991 | Ku et al. | 437/195 |
| 5,043,297 | 8/1991 | Suzuki et al. | 437/195 |
| 5,049,525 | 9/1991 | Coleman, Jr. | 437/195 |

FOREIGN PATENT DOCUMENTS

| | | | |
|---|---|---|---|
| 1-248536 | 10/1989 | Japan | 437/195 |
| 2-285658 | 11/1990 | Japan | 437/195 |

*Primary Examiner*—Brian E. Hearn
*Assistant Examiner*—Laura M. Holtzman
*Attorney, Agent, or Firm*—William J. Bethurum

[57] ABSTRACT

A process for making vertical electrical interconnections in a variety of integrated circuits and novel IC structures produced thereby wherein buried conductors are provided within a dielectric layer located above a silicon substrate having active or passive devices formed therein. Internal edges of only one or selected ones of the conductors are provided with an insulating coating, so that an adjacent via may be filled with a conductive material and still be electrically isolated from the one conductor or conductors. One or more vias are etched directly through the other buried conductor or conductors and also filled with a conductive material which electrically connects this buried conductor or conductors to both the substrate and to an upper level of metallization, and alternatively to intermediate conductors or other components. In this manner, lateral offset spacing requirements for masking and etching is minimized to thereby maximize the achievable component packing density within the IC structure being manufactured.

3 Claims, 2 Drawing Sheets

METHOD OF MAKING SELF-ALIGNED CONTACTS AND VERTICAL INTERCONNECTS TO INTEGRATED CIRCUITS

TECHNICAL FIELD

This invention relates generally to multi-level conductor (MLC) integrated circuits wherein these conductors are typically fabricated of either a selected metal or polycrystalline silicon. More particularly, this invention is directed to a self-aligned vertical interconnect process which operates to maximize the achievable packing density within the integrated circuit being manufactured.

BACKGROUND ART

In many fields of integrated circuit manufacturing, such as in the manufacture of dynamic random access memories (DRAMs) which use multiple levels of metal or polysilicon which have been photolithographically defined above the surface of a silicon substrate, it becomes necessary to provide certain different types of electrical connections between the various conductive levels and active or passive devices within an underlying substrate. For example, in the fabrication of DRAMs, it is customary to provide photolithographically defined word lines at one level within the integrated circuit structure and photolithographically defined bit or digit lines at another level within the integrated circuit structure. It is then also necessary to further provide certain vertical interconnects between the word and bit lines and certain devices such as access transistors fabricated within the silicon substrate.

In addition to the above requirements, there is also the requirement that electrical isolation be provided between the word and bit lines at certain locations and to provide electrical interconnections between the word and bit lines at certain other locations where it is desired to electrically join and connect a particular word line to a particular bit line or to a storage device such as a stacked capacitor in order to provide a desired read, write, or refresh data operation for the DRAM.

In the past, the above described electrical isolation between multi-level conductors in the integrated circuit was achieved by first defining an opening in one intermediate layer of conductor through which a vertical interconnection was provided between an upper layer conductor and a lower integrated circuit component without the vertical interconnect touching and shorting to the one intermediate conductive layer. Similarly, when it was desired to electrically connect an upper layer conductor to an intermediate conductive layer or to a lower device area within the integrated circuit, the patterns of metallization would be laterally spaced apart so that vias carrying the conductive interconnect from one layer would be laterally removed by a predetermined mask distance from the vias carrying the metallization interconnecting to an adjacent conductive layer.

The disadvantage with using both of the above electrical isolation and electrical interconnect techniques was that they impose an inherent photolithographic dimensional limitation on the maximum achievable packing density that can be obtained within the integrated circuit structure. It is the solution to this latter problem to which the present invention is directed.

DISCLOSURE OF INVENTION

The general purpose and principal object of the present invention is to provide a new and improved self-aligned vertical interconnection process useful in the manufacture of multi-level conductor (MLC) integrated circuits which operates to remove the above described maximum achievable packing density limitation imposed by the above prior art processes.

Another object of this invention is to provide a new and improved self-aligned vertical interconnection process of the type described which is elegantly straightforward in application and may be carried out at relatively high yields using state-of-the-art planar processing techniques and a minimum number of interconnect, masking and etching processing steps.

To accomplish the above purpose and objects, and gain significant other attendant advantages of the present invention, the present process includes the steps of:

a. providing a selected substrate having active or passive devices therein to which external electrical connections need to be made, b. forming a dielectric layer on the substrate and having certain conductive strips therein which must be connected to these devices and certain other conductive strips therein which must be maintained electrically isolated from these devices, c. opening a first via or vias in the dielectric layer above those conductive strips to be electrically isolated and treating the edges of these strips exposed by the vias to provide an insulating coating thereon, d. continuing the first via or vias on through to the surface of the substrate, while additionally e. opening a second via or vias through the conductive strips within the dielectric coating which are to be connected to devices in the substrate, and then f. forming vertical electrical interconnects in the first and second vias whereby the vertical interconnects may be formed in the same multi-level conductor processing step in order to thereby minimize the lateral spacing required for both electrical isolation of the first conductive strip or strips and the electrical interconnection to the second conductive strip or strips and between the second conductive strip or strips and the substrate.

The brief summary of the invention, together with its objects and advantages, will become better understood with reference to the following description of the accompanying drawings.

DETAILED DESCRIPTION OF THE DRAWINGS

Figure 1:
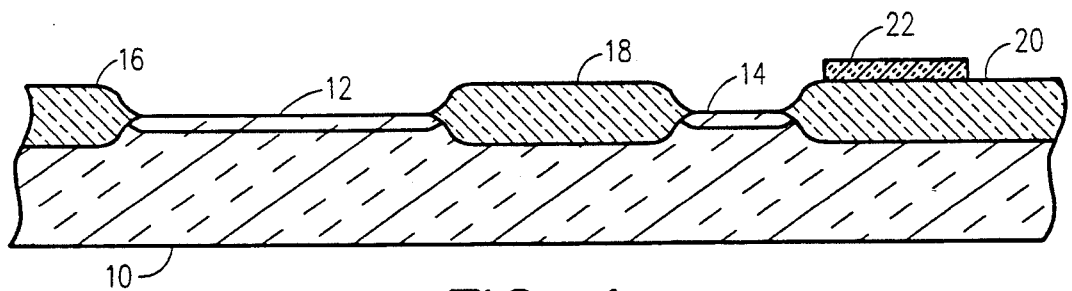
FIGS. 1 through 7 are a series of abbreviated schematic cross-section views which illustrate a sequence of process steps used in fabricating integrated circuit structures according to a preferred embodiment of the invention.

Referring now to FIG. 1, there is shown a substrate starting material 10 which has been treated using conventional semiconductor planar processing techniques in order to form active device regions 12 and 14 adjacent to the surface of the substrate 10 and separated by thick regions 16, 18, and 20 of field oxide. These device-forming and field oxidation techniques are well known in the art and therefore are not described in detail herein. The formation of the active device regions 12 and 14 is accomplished using conventional masking and doping techniques, such as diffusion and ion implantation, in order to form, for example, active regions of MOS access or driver transistors. These processes are also well known in the art and are not described in detail herein. The structure in FIG. 1 may further and typically have a first level of conductor thereon such as strip of polycrystalline silicon or polysilicon 22 which has been developed in the geometry shown on the surface of the field oxide region 20.

Figure 2:
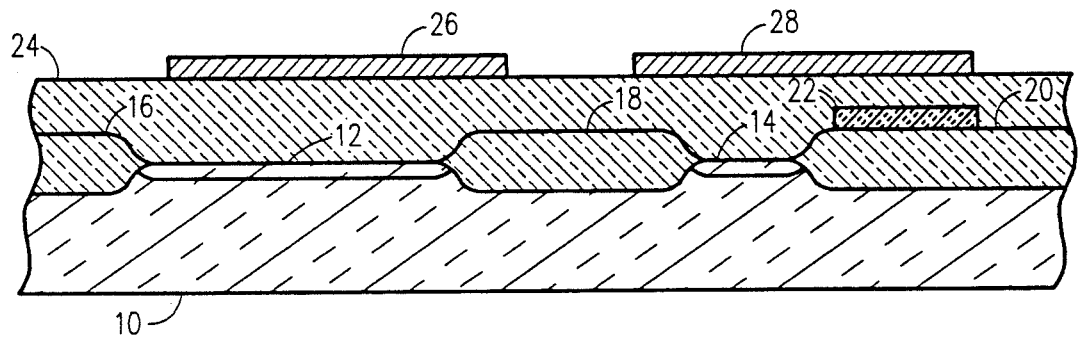

The structure shown in FIG. 1 is then transferred to a conventional oxidation forming and polysilicon development station wherein initially a thick layer of silicon dioxide 24 is formed on the surface of the structure shown in FIG. 2. Thereafter, the oxide layer 24 is covered with a layer of polysilicon (not shown) which is subsequently masked and etched to leave the two strips 26 and 28 of polysilicon intact on the upper surface of the silicon dioxide dielectric layer 24.

Figure 3:
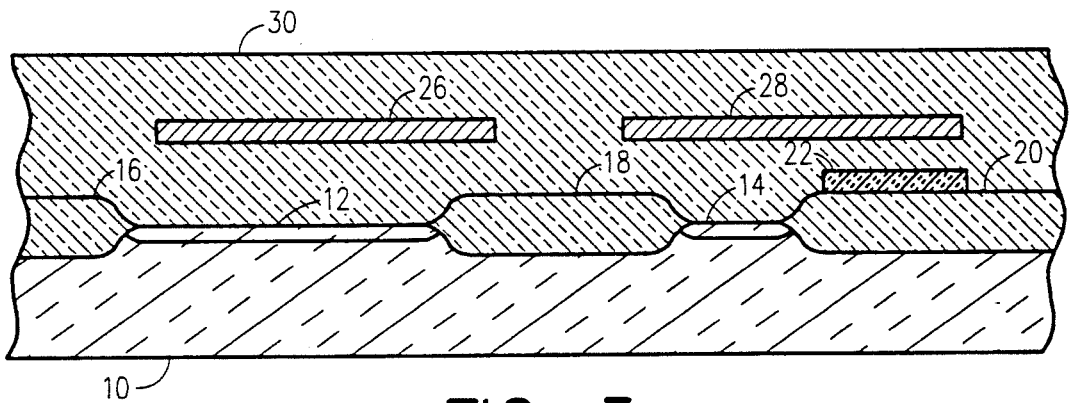

Referring now to FIG. 3, the substructure shown in FIG. 2 is then exposed to another oxidation step wherein an upper surface layer of silicon dioxide 30 is deposited on all of the exposed surfaces of the two strips 26 and 28 of polysilicon and underlayer of silicon dioxide 24 so as to leave these strips of polysilicon completely surrounded and buried within the silicon dioxide dielectric material. These strips 26 and 28 of polysilicon may typically be bit or digit lines for a dynamic random access memory (DRAM) or other similar or equivalent type of integrated circuit.

Figure 4:
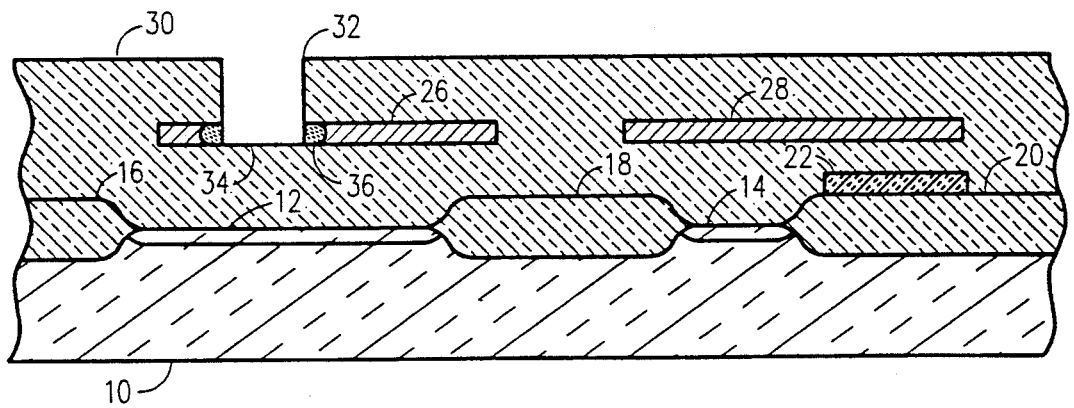

Referring now to FIG. 4, there are two different types of vertical interconnections which may be useful in completing the integrated circuit structure in accordance with the present invention. The first of these interconnections is one wherein the vertical interconnect is made to pass completely through one of the polysilicon strips 26, but yet remain electrically isolated from the polysilicon strip 26 as it passes vertically downward and makes contact to the active transistor region 12. This interconnection is accomplished by the process illustrated in FIG. 4 wherein initially the structure in FIG. 3 is transferred to an oxide masking station where conventional masking and etching techniques are utilized to create the opening 32 in the surface of the silicon dioxide layer 30. This opening 32 is created by etching out the silicon dioxide material until it reaches a trough level 34 which is approximately co-planar with the undersurface of the polysilicon strip 26. At this point in the process, the now-exposed edges of the polysilicon strip 26 are subjected to an oxidation or other similar dielectric-forming step so as to provide an annular oxidized region indicated at 36 in FIG. 4.

Figure 5:
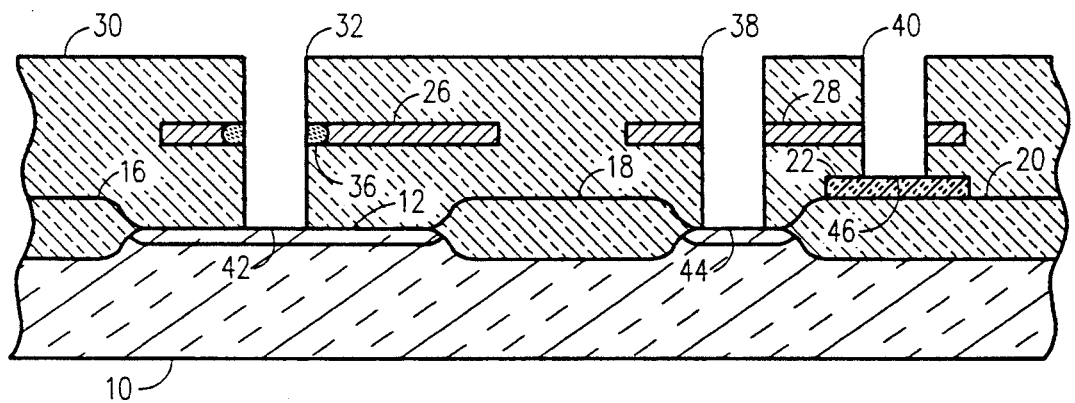

Referring now to FIG. 5, the second type of electrical vertical interconnect which may be desirable in the present process is one which electrically interconnects the polysilicon strip 28 to, for example, both an active device region 14 within the substrate 10 and to a first level of conductor 22 disposed as shown on the upper surface of the field oxide region 20. This is accomplished by transferring the substructure in FIG. 4 to a conventional masking and etching station wherein not only are additional openings 38 and 40 created vertically in the right hand side of the structure, but additionally the exposed floor or trough region 34 of FIG. 4 is simultaneously vertically etched on down to the now exposed area 42 on the surface of the active device region 12. During this step in the process, the areas 44 and 46 on the right hand side of the structure shown in FIG. 5 are now exposed for purposes of making electrical interconnects thereto.

Figure 6:
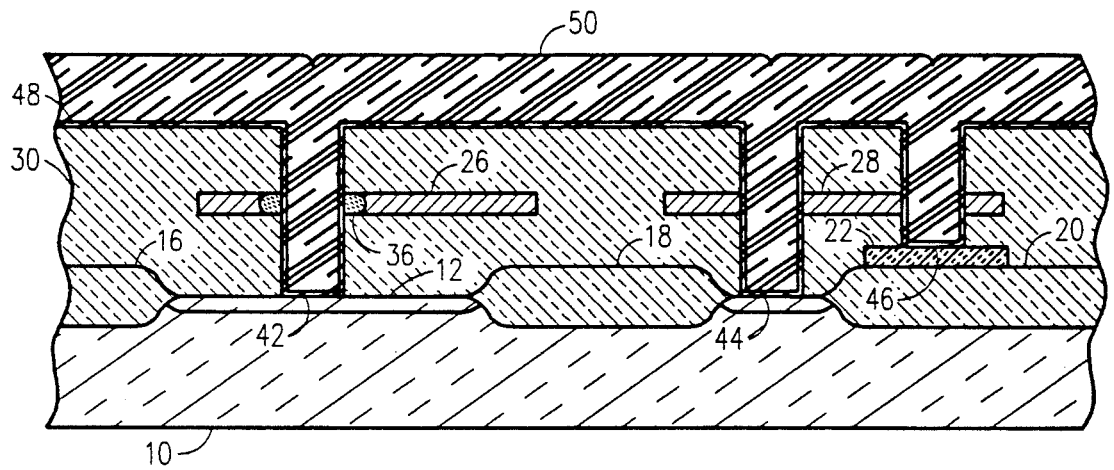
Figure 7:
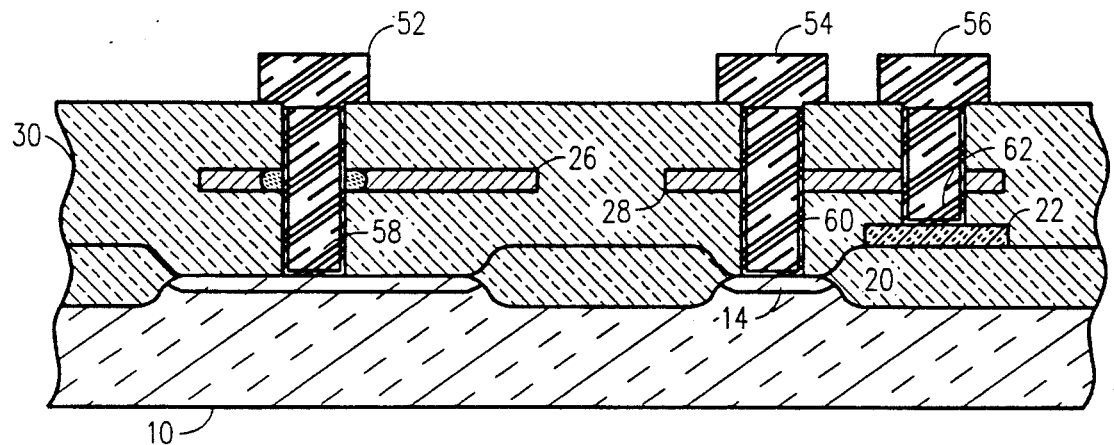

Referring now to FIG. 6, the next step in the process is to fill the vertical openings 32, 38, and 40 as shown in FIG. 5 with a suitable metallization which will typically consist of a first thin surface coating 48 such as titanium nitride which will subsequently be covered with a selected metal such as a layer 50 of tungsten. Then, as shown in FIG. 7, the layer 50 of tungsten may subsequently be masked and etched to form the three upper discrete contact regions 52, 54, and 56 as indicated on the upper surface of the silicon dioxide layer 30.

Thus, there has been described the formation of a first or left hand vertical interconnect 58 which connects the upper surface contact 52 to the active transistor region 12, passing through the strip 26 of polysilicon, while being completely electrically isolated therefrom. On the other hand, the vertical interconnects 60 and 62 on the right hand side of the structure shown in FIG. 7 provide direct electrical interconnection between the polysilicon strip 28 and both the active transistor region 14 and the first layer 22 of conductor on the surface of the field oxide layer 20 as previously described.

Various modifications may be made in and to the above described preferred embodiment without departing from the spirit and scope of this invention. For example, it is to be understood that the electrical interconnection process described herein is useful in the fabrication of a wide variety of electrical devices wherein significant chip area is to be conserved by not requiring that physical isolation be maintained between a first polysilicon strip 26 and an adjacent electrical interconnect 58 as shown on the left hand side of FIG. 7 and further by not requiring the lateral offset spacing of the prior art as previously described when making direct electrical interconnections 60 and 62 between multiple layers and multiple levels of conductors in a multilevel conductor type integrated circuit. It is also to be understood that the present invention is not limited to the particular conductive or dielectric materials identified herein and may be employed with other dielectric materials such as silicon nitride, $Si_3N_4$, and with other conductors such as the alloys of titanium and refractory metals such as tungsten silicide, $WSi_2$, and titanium silicide, $TiS_2$. Also, it will be appreciated that the present invention is not limited to the use of metals in the vertical vias created in the oxide layers, and if desired, these vias may be filled with polysilicon as well. Accordingly, these and other process and device design variations are clearly within the scope of the following appended claims.

I claim:

1. A process for manufacturing multi-level conductor type integrated circuits which includes the steps of:
   a. providing a semiconductor substrate having active or passive devices therein to which electrical connections must be made,
   b. forming a dielectric layer on said substrate having certain strips of conductor therein which must be connected to said devices and certain strips of conductor therein which must be maintained electrically isolated from said devices,
   c. opening first vias in said dielectric layer above conductive strips to be electrically isolated and exposing edges of said conductive strips,
   d. insulating said edges of said strips exposed by said vias, e. continuing to etch said first vias on through to reach said semiconductor substrate, while also f. opening second vias through said conductive strips which are to be connected to said substrate, and then g. forming vertical electrical interconnects in said first and second vias whereby said active and passive devices in said semiconductor substrate may be both electrically connected to and isolated from said conductive strips within said dielectric layer and may be further interconnected to a surface layer of conductor on the surface of said dielectric layer.

2. The process defined in claim 1 wherein said conductive strips are polysilicon which are insulated by the formation of a silicon dioxide coating thereon.

3. The process defined in claim 2 wherein said vertical electrical interconnects are formed within said first and second vias by first coating said vias with a layer of materials selected from the group consisting of titanium or titanium alloys, titanium nitride, and refractory metals and then coating said layer with tungsten.

* * * * *